United States Patent [19]

Holdren et al.

[11] 4,132,946

[45] Jan. 2, 1979

[54] DIGITAL READOUT TEST PROBE

[75] Inventors: Earl J. Holdren, Windsor, Canada; Peter Polasek, Grosse Pointe; Thaddeus W. Krzys, Jr., Troy, both of Mich.

[73] Assignee: Chrysler Corporation, Highland Park, Mich.

[21] Appl. No.: 650,331

[22] Filed: Jan. 19, 1976

[51] Int. Cl.² .................... G01R 31/02; G01R 19/16
[52] U.S. Cl. ................................ 324/73 R; 324/72.5; 324/158 P
[58] Field of Search ............... 324/73 R, 73 PC, 72.5, 324/99 D, 158 P, 158 F, 52, 149, 133; 340/347 DD; 339/226 SD, 255 P, 75 MP, 174, 113

[56] References Cited

U.S. PATENT DOCUMENTS

| | | | |
|---|---|---|---|
| 2,945,204 | 7/1960 | Berger | 339/113 B |
| 3,094,212 | 6/1963 | Moore et al. | 324/73 AT |
| 3,268,888 | 8/1966 | Priebs | 340/347 |
| 3,577,141 | 5/1971 | Quintero | 340/347 |
| 3,728,530 | 4/1973 | Alexander | 235/155 |
| 3,750,015 | 7/1973 | Sheker et al. | 324/72.5 |
| 3,831,149 | 8/1974 | Job | 340/172.5 |
| 3,870,953 | 3/1975 | Boatman et al. | 324/73 R |
| 3,893,028 | 7/1975 | Febvre et al. | 324/115 |
| 3,899,239 | 8/1975 | Allard | 339/255 |

*Primary Examiner*—Gerard R. Strecker
*Attorney, Agent, or Firm*—Baldwin & Newtson

[57] ABSTRACT

A digital readout test probe comprises: a dual in-line pin, clip-on-type connector for connection to a dual in-line pin integrated circuit; a housing containing a single digit decimal readout display; and a converter circuit whose output drives the readout and whose input is coupled with the clip-on connector by means of color coded lead wires. The display and converter circuit are energized from a separate power supply. When the connector is operatively connected with an integrated circuit, signals from selected terminal pins of the integrated circuit are supplied through the lead wires to the converter circuit. The selected terminal pins provide a binary coded decimal signal and the display shows the decimal value of the binary coded decimal signal so that the user of the probe does not have to decode the binary coded decimal signal into decimal form. The clip-type connector comprises a plurality of conductors each of which conducts a signal from a corresponding terminal pin of the integrated circuit. Each lead wire is uniquely color coded according to the significance of the particular binary digit (bit) input of the converter circuit to which one end of it is fixedly connected. The other end of each lead wire terminates in a hollow pin terminal which may be manually engaged with, and disengaged from, any of the conductors of the clip-type connector whereby the test probe may be conveniently programmed for use with any of the large number of available dual in-line pin integrated circuits.

7 Claims, 4 Drawing Figures

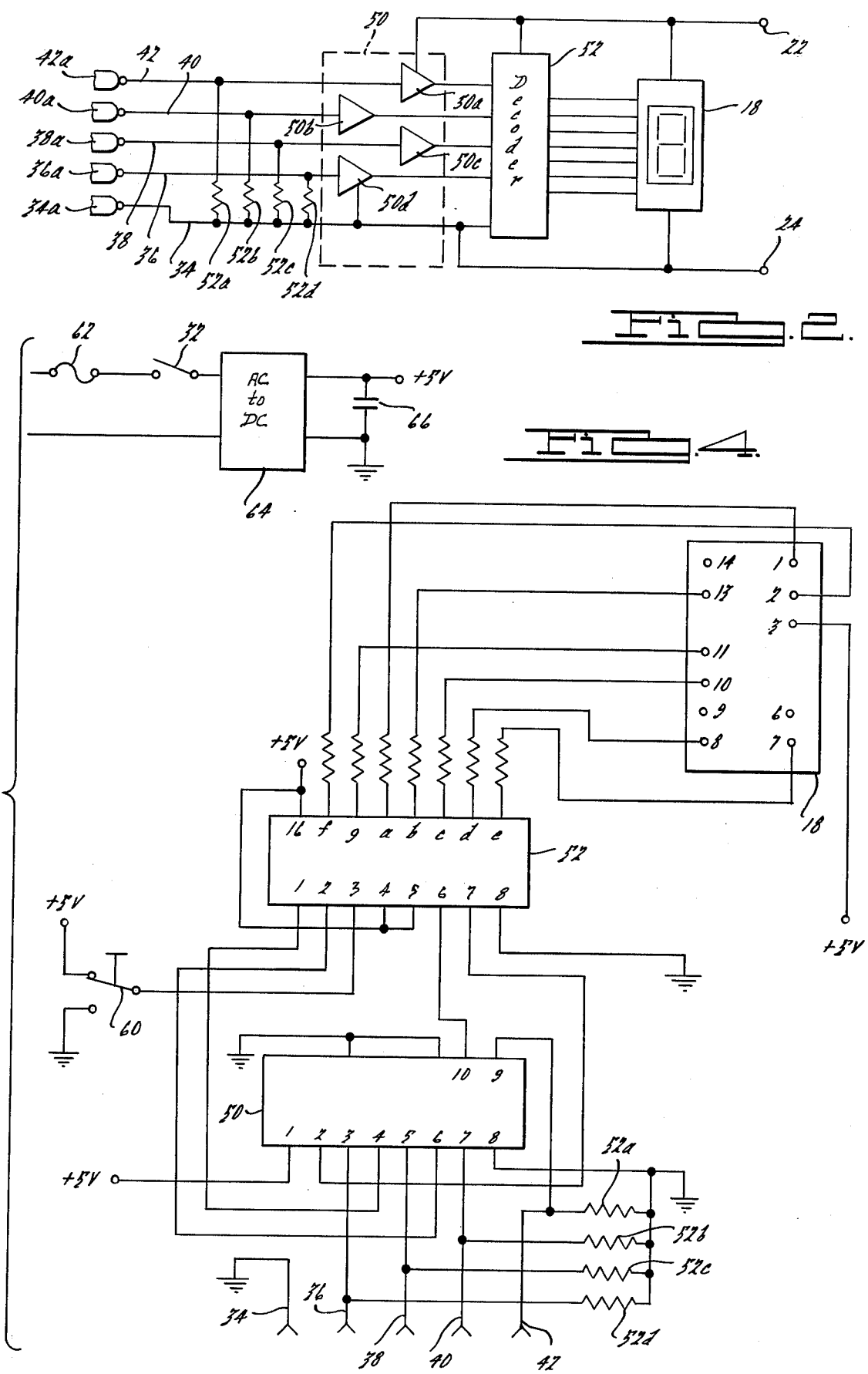

1

DIGITAL READOUT TEST PROBE

BACKGROUND AND SUMMARY OF THE INVENTION

This invention pertains to test equipment for electronic circuits and is particularly concerned with a novel digital readout test probe which is especially useful in providing a decimal readout of a binary coded decimal signal appearing at selected terminal pins of an integrated circuit.

In designing, developing, testing and/or repairing digital electronic circuits, it is useful for the technician or engineer to know the condition of signals at selected test points of the circuits. With the increasing use of microelectronic devices in digital circuits, it is important that test equipment for such digital circuitry provide maximum utility and convenience to the person using the equipment. Because present digital circuit technology operates with binary type logic signals, testing of other than the simplest circuit can be a time consuming procedure. Moreover, with the miniaturized microcircuitry, the task of physically making an electrical connection with a desired test point on the circuit can be difficult.

A number of prior testing devices of the type to which the present invention relates are known in the art. A novelty search in the United States Patent Office conducted in connection with the present invention developed the following U.S. patents which show illustrative test probes: U.S. Pat. Nos. 3,300,718; 3,667,037; 3,670,245; 3,750,015; 3,761,808; 3,810,012; 3,870,953; and 3,882,386. One problem with prior test equipment is that it is incapable of quickly and reliably presenting information as to the condition of the digital circuit signals in a form which is readily intelligible to the user of the test equipment. Another problem is that it is generally not compatible with the many different types of specific digital integrated circuits which are now on the market.

Accordingly, the present invention is directed to a novel and extremely useful digital readout test probe for use by electronic technicians and engineers in designing developing, testing and/or repairing systems incorporating digital circuits. One feature of the present invention is that it is directly compatible with various types of microcircuits including DTL, TTL, and CMOS type systems. The probe contains its own power supply and possesses extremely high input impedance, and thus, cannot load down the digital circuits under test. Moreover, the probe can accept input signals over the voltage ranges customarily prevailing in present digital circuits.

Another feature of the invention is that it provides a digital decimal display representative of a binary coded decimal signal present in the circuit under test. This is important in that information as to the performance of the digital circuitry under test is readily displayed in an intelligible form to the user of the probe.

A further feature of the invention is that the probe can be programmed to monitor data for any possible pin configuration in an integrated circuit under test. Connection to the circuit under test is via a clip-on type connector which is coupled via color coded lead wires to a converter circuit which drives the decimal readout display. The lead wires terminate in hollow terminal connector pins which may be mated with selected conductor pins on the connector in accordance with the pin configuration of the integrated circuit under test. This is important in providing maximum versatility and operator convenience so that even in complicated digital circuits containing numerous different types of integrated circuit devices, testing can be accomplished with a single piece of equipment which is readily programmed according to each specific device under test.

Ancillary features of the present invention include its compact size permitting portability and use in close quarters; a self-test feature for testing the operability of the probe circuitry and display; and color coding for each lead wire according to the significance of the digital signal conducted thereby.

The foregoing features, advantages and benefits of the present invention, along with additional ones, will be seen in the ensuing description and claims which are to be considered in conjunction with the accompanying drawings.

The drawings illustrate two presently preferred embodiments of the present invention according to the best mode presently contemplated in carrying out the invention.

BRIEF DESCRIPTION OF THE DRAWINGS

FIG. 2 is an electronic schematic diagram of circuitry contained in the probe of FIG. 1.

FIG. 4 is an electronic schematic diagram of electronic circuitry contained in the probe of FIG. 3.

DESCRIPTION OF THE PREFERRED EMBODIMENT

Figure 1:
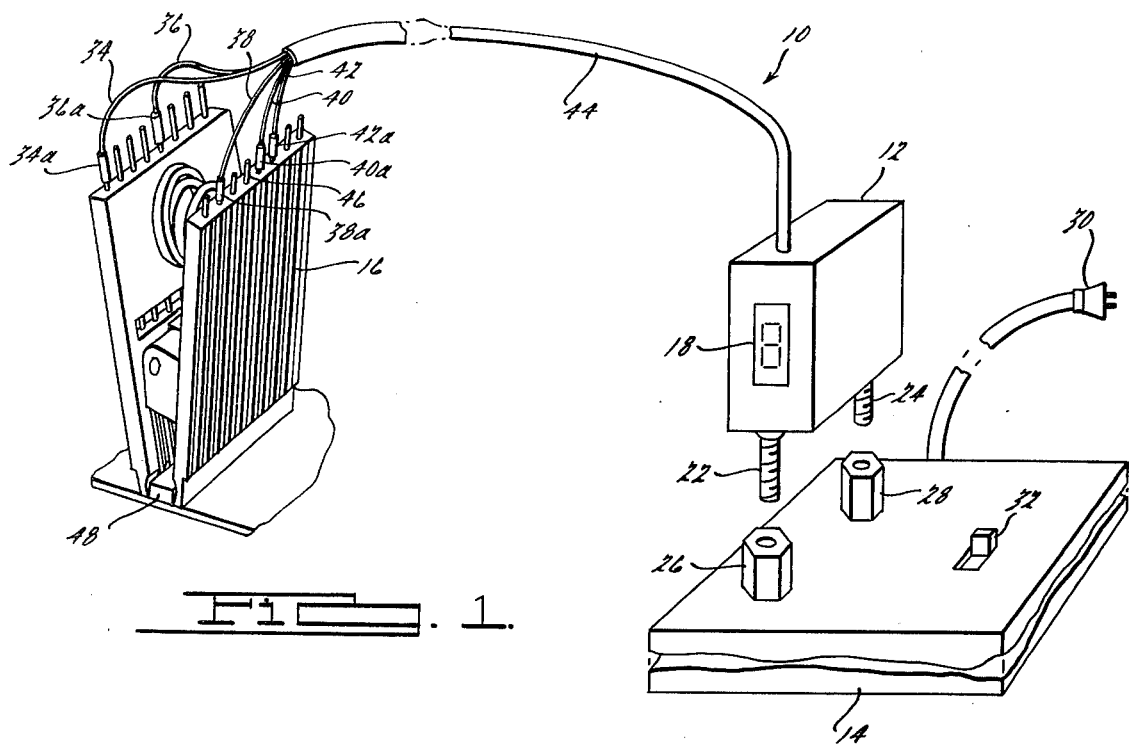
FIG. 1 is a perspective view illustrating a first embodiment of digital readout test probe embodying principles of the present invention.

The first embodiment of probe 10 according to the present invention shown in FIGS. 1 and 2 comprises a housing 12, a power supply 14 and a connector 16. Housing 12 contains a digital readout display 18 which can display each of the ten decimal digits 0 through 9, one at a time. Also contained within housing 12 is an electronic converter circuit 20 which converts digital information from the circuit under test to drive display 18. A pair of connector plugs 22 and 24 project from housing 12 for insertion into mating receptacles 26 and 28 on power supply 14. Power supply 14 is entirely conventional and develops a regulated DC voltage of appropriate potential between receptacles 26 and 28 which is supplied via terminals 22 and 24, when engaged therewith, to drive display 18 and converter circuit 20. Power supply 14 further includes a conventional wall plug 30 which may be plugged into a conventional service receptacle (for example 115 VAC, 60 hz) to energize the power supply. An on-off switch 32 controls the availability of DC power at receptacles 26 and 28 to thereby turn the probe on and off. Connector 16 is electrically connected with the converter circuit 20 inside housing 12 by means of a plurality of individual lead wires of appropriate length. In the illustrated embodiment five lead wires 34, 36, 38, 40 and 42 are utilized. The lead wires may be contained within a suitable sheath 44 for most of their length from housing 12. In order to facilitate the identification of the lead wires, they are preferably uniquely coded, for example, by unique color coded insulation on each lead wire. By way of example, lead wire 34 may be coded with black insulation, lead wire 36 with brown insulation, lead wire 38 with red insulation, lead wire 40 with yellow insulation and lead wire 42 with white insulation. Each of the lead wires 34, 36, 38, 40 and 42 terminates in a hollow push-on type terminal pin, 34a, 36a, 38a, 40a, and 42a, which may be covered by a tubular insulator sleeve. The terminal pins 34a, 36a, 38a, 40a and 42a are identical and each may be manually engaged with and disengaged from the free end of any one of the conductor elements 46 of connector 16.

Connector 16 is a conventional dual in-line pin clip-type connector for making connection with each of the terminal pins of a conventional dual in-line pin type integrated circuit device 48. The illustrated clip is for a sixteen pin configuration having two rows of eight conductors 46. Thus, when connector 16 is properly clipped onto integrated circuit 48, the signal appearing at each of the terminal pins of the integrated circuit is also conducted via the corresponding conductor 46 which is in contact therewith. By connecting each of the terminal pins 34a, 36a, 38a, 40a and 42a, with the appropriate conductor 46, the probe is connected with the desired terminal pins on integrated circuit 48 to monitor the signals appearing at those terminal pins.

As mentioned earlier, the present invention is especially well-suited for testing integrated circuit digital circuits wherein the signals at certain terminal pins of the integrated circuits are in the form of binary digits (bits) and four of the binary digits form a binary coded decimal signal. Converter circuit 20 is adapted to convert a binary coded decimal signal into an appropriate signal for driving display 18 whereby the decimal number appearing on display 18 is representative of the decimal value of the binary coded decimal signal. Accordingly, there are four input circuits to converter circuit 20, one for each binary digit of the binary coded decimal signal. The most significant binary digit of the binary coded decimal signal is conducted via lead wire 42 to the most significant bit input of converter circuit 20; the next most significant via lead wire 40 to the next most significant bit input; the next most significant via lead wire 38 to the next most significant bit input; and the least significant via lead wire 36 to the least significant bit input. A common return path is provided via lead wire 34. By color coding the lead wires, as explained above, the terminal pins 34a, 36a, 38a, 40a, and 42a may be readily mated with the appropriate conductors 46 of connector 16 for a given output terminal pin configuration of the specific integrated circuit 48 under test. This provides a programming feature whereby the probe may be conveniently and quickly programmed to conform to any output configuration for any particular integrated circuit. The importance of this feature can be appreciated when one realizes that in commercially available integrated circuits which generate binary coded decimal signals, there is no established standard for which terminal pins on the integrated circuit should be used for the binary coded decimal signal and that pins utilized for binary coded decimal signals vary from device to device.

Converter circuit 20 comprises in detail a buffer section 50 and a decoder section 52. Buffer section 50 comprises four individual buffers 50a, 50b, 50c, and 50d, each of which has its input connected to a corresponding one of the lead wires 36, 38, 40 and 42. An input impedance resistor is connected between the input of each buffer and the return line 34, the latter also connecting with each individual buffer. The resistors are designated 52a, 52b, 52c, and 52d. The outputs of the four buffers 50a, 50b, 50c, and 50d are connected with corresponding inputs of decoder 52. In turn the outputs of decoder 52 are coupled with appropriate inputs of display 18. It will be noted that buffer section 50, decoder section 52 and display 18 are energized from the DC voltage supplied by power supply 14 across the terminals 22 and 24. The input impedance resistors 52a, 52b, 52c and 52d in conjunction with the individual buffers 50a, 50b, 50c and 50d present an extremely high input impedance to the signals supplied from the integrated circuit via connector 16 and lead wires 36, 38, 40, and 42 so that the probe operates for all practical purposes with zero power draw from the integrated circuit and all power supplied from power supply 14. Furthermore, the converter circuit is advantageous in that compatibility is attained with different types of logic, for example DTL, TTL, and CMOS, and input signals can be accepted over an appreciable voltage range, for example, from 4.5 volts to 15 volts. By way of example, buffer section 50 may comprise an RCA CD 4050 integrated circuit device, decoder section 52 a Motorola MC 7447 integrated circuit device, and display 18 a Monsanto numerical display MAN1A. It will be observed that display 18 comprises a plurality of seven individual energizable segments which in toto form the numeral eight. However, these individual elements are selectively energizable by decoder 52 in accordance with the binary coded decimal signal input to buffer section 50, so that one of the ten decimal digits zero through nine will be displayed on the display in accordance with the value of the binary coded decimal signal appearing at the selected test points of the integrated circuit under test. The entire probe thus provides an extremely useful, versatile device and it possesses a compact size which is desirable for test equipment.

Figure 3:
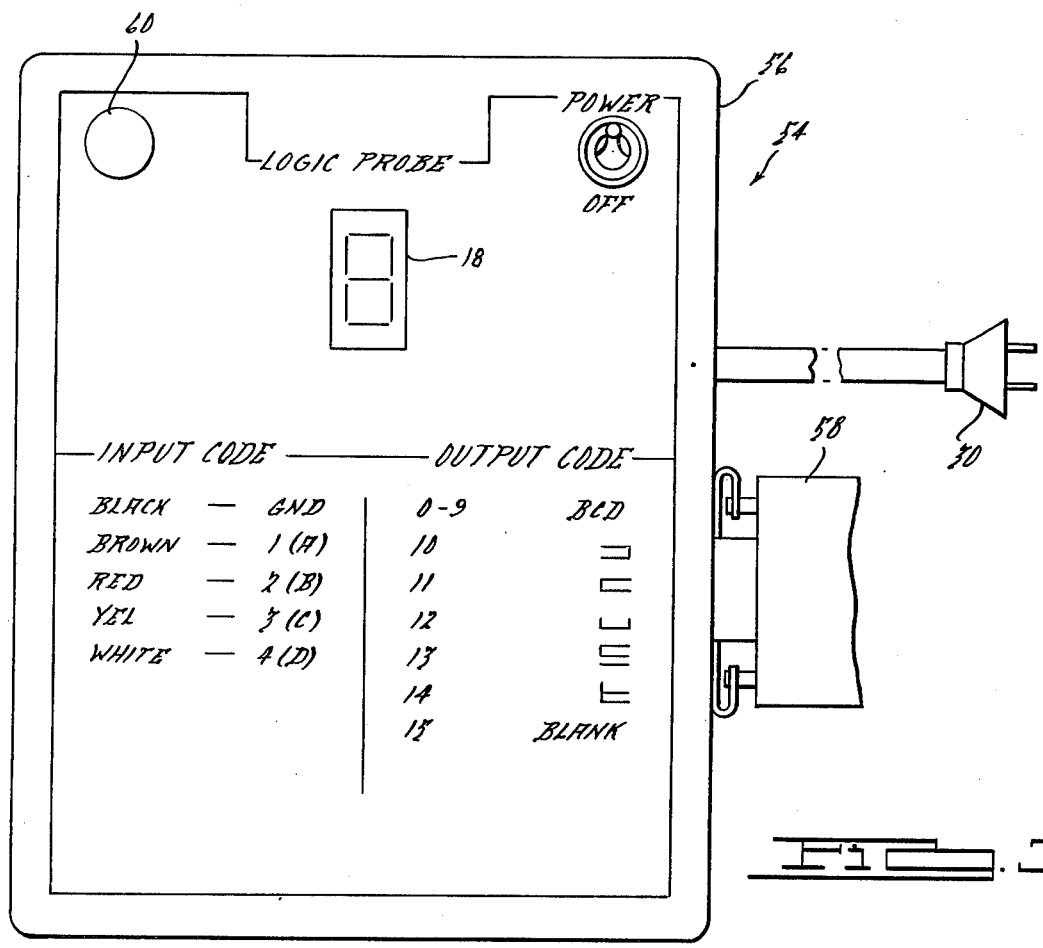
FIG. 3 is a front view of a second embodiment of probe embodying principles of the present invention.

FIGS. 3 and 4 illustrate a second embodiment of probe 54 according to principles of the present invention. Probe 54 comprises a somewhat larger housing 56 than in the first embodiment and this larger housing contains a legend thereon showing both input and output codes. The larger housing 56 contains the DC power supply for the display and converter circuitry with the cord and plug 30 emanating from the housing. The second embodiment also differs from the first embodiment in that the lead wires 34, 36, 38, 40 and 42 terminate at the housing in a connector plug 58 which plugs into and is keyed with a mating receptacle mounted in the side wall of housing 56. The provision of connector plug 58 and the mating receptacle on housing 56 enables the connector 16 and lead wire bundle to be disconnected from housing 56; however, the lead wires at their opposite ends still terminate in the hollow terminal pins 34a, 36a, 38a, 40a, and 42a for programmable connection with the conductor pins 46 on connector 16.

The input code legend relates the color coded lead wires with the significance of the binary digits which are to be monitored in the integrated circuit under test. Thus, the brown lead wire 36 represents the $2^0$ binary digit, the red lead wire 38 the $2^1$ binary digit, the yellow lead wire 40 the $2^2$ binary digit, and the white lead wire 42 the $2^3$ binary digit. Many present integrated circuit terminal pin designations assign the numeral 1 or the letter A to the $2^0$ binary digit, the numeral 2 or the letter B to the $2^1$ binary digit, the numeral 3 or the letter C to the $2^2$ binary digit, and the numeral 4 or the letter D to the $2^3$ binary digit. The provision of the input code legend on the face of the housing serves as a convenient reminder to the user. The output code legend relates the character appearing on display 18 with the decimal number. For the ten binary coded decimal representations of the ten decimal digits zero through nine, the character displayed on display 18 is the decimal number. However, since in a malfunctioning integrated circuit under test, it is possible that erroneous binary coded decimal signals will be generated (specifically binary coded decimal representations of the decimal numbers ten through fifteen inclusive), the converter circuit and display are capable of generating on the display characters representative of such erroneous binary coded decimal numbers. The output code illustrates these characters for the binary coded decimal equivalents of the decimal numbers ten through fourteen and for the binary coded decimal representation of the decimal number fifteen, the display is blank. By providing these character representations for erroneous binary coded decimal numbers, trouble shooting of a circuit under test is often facilitated.

In the overall operation, the second embodiment of probe 54 is the same as that of probe 10 in the first embodiment. FIG. 4 illustrates an electronic schematic diagram of the probe circuitry which has several differences from that of probe 10. By way of illustration, the circuit of FIG. 4 comprises for buffer section 50, a Motorola integrated circuit device MC14050CP; for the decoder section 52 and display 18, a Monsanto device MDA1601. FIG. 4 illustrates the specific connection of the devices in circuit with the reference numerals and characters on each device corresponding to the manufacturers termial designations. A self-test feature is provided by means of a push-to-test switch 60 which is located on the front face of housing 56. Switch 60 is electrically connected in circuit as illustrated in FIG. 4 so that upon actuation of switch 60, a ground signal is applied to decoder section 52 which, if the decoder and display are operating properly, causes all seven segments of display 18 to be energized.

FIG. 4 also shows the power supply circuit for developing the appropriate DC voltage for the converter and display. This power supply circuit has an input which receives the usual AC power through a fuse 62 and the power on-off control switch 32. An AC to DC converter device 64, by way of example, a National Semiconductor model number P741-5005S, whose output is paralleled by a capacitor 66, is utilized to develop the DC potential, which is illustratively +5 volts.

From the foregoing description it will be appreciated that a novel and versatile piece of test equipment has been invented. The invention has been found to be well suited for use both in the laboratory as well as in the field. While preferred embodiments have been disclosed and described in detail it is to be understood that these are merely illustrative of principles of the invention and that the scope of the invention is to be measured by the following claims.

What is claimed is:
1. A digital readout test probe for displaying a decimal number representation of the value of a binary coded decimal signal appearing at selected test points in a circuit under test comprising:
   a single digit decimal display for visibly displaying single digit decimal numbers;
   a connector means for making connection with the selected test points of the circuit under test, said connector means comprising a dual in-line clip-type connector for making connection with a dual in-line pin type integrated circuit, said connector comprising a plurality of individual conductors for making connection with predetermined pins on a dual in-line pin type integrated circuit;
   a converter circuit having an input operatively coupled with said connector means and an output operatively coupled with said display;
   a set of four coded lead wires, each of which is associated with a corresponding bit of a binary coded decimal, and each of which connects a selected one of said conductors to said converter circuit for conveying a corresponding binary signal from one of the selected test points to said converter circuit, said lead wires being manually disconnectable from said selected conductors and reconnectable with other selected ones of said conductors;
   a power supply separate from the circuit under test for powering said converter circuit and said display without powering the circuit under test;
   said converter circuit comprising means for causing the display to show a single digit decimal number representative of the decimal value of the binary coded decimal signal appearing at the selected test points of the circuit under test with essentially all power draw for said converter circuit and said display being from said power supply and essentially zero power draw from the circuit under test.

2. A probe as claimed in claim 1 wherein said connector means is additionally coupled with said converter circuit via a common return wire.

3. A probe as claimed in claim 1 wherein said four coded lead wires are each uniquely color coded.

4. A probe as claimed in claim 1 including a manually operable self-test circuit means energized from said power supply for self-testing said converter circuit and display.

5. A probe as claimed in claim 4 wherein said self-test circuit means comprises a test switch which when actuated energizes all elements of said display so long as said converter circuit and display are operating properly.

6. A digital readout test probe for displaying a decimal number representation of binary signals appearing at selected test points in a circuit under test comprising:
   a digital readout decimal display for visibly displaying decimal numbers;
   a connector means for making connection with the selected test points of the circuit under test;
   a converter circuit having an input adapted to receive the binary signals and an output operatively coupled with said display, said converter circuit comprising means for causing said display to show a decimal number representation of the binary signals at its input;
   and means operatively coupling the input of said converter circuit with said connector means comprising a plurality of individual lead wires, each of which is uniquely coded, and each of which is connected, via a corresponding individual conductor of said connector means, with a corresponding one of the selected test points of the circuit under test, each lead wire terminating in a connector which is matingly engaged with the corresponding individual conductor of said connector means and which may be manually disengaged therefrom and matingly engaged with another individual conductor of said connector means;
   wherein said connector means comprises a dual in-line clip-type connector for making connection with a dual in-line pin type integrated circuit, said individual conductors of said connector means being arranged in a dual in-line configuration, each conductor having one end for connection to a pin of an integrated circuit under test and its other end projecting above the half of the clip on which it is disposed, each lead wire connector being mated with the projecting end of one of said conductors; and a power supply separate from the circuit under test for powering said converter circuit and said display without powering the circuit under test so that essentially all power draw for said converter circuit and said display is from said power supply and essentially zero power draw is from the circuit under test.

7. A digital readout test probe as claimed in claim 6 wherein said converter circuit comprises means for causing said display to indicate a decimal number representative of the value of a binary coded decimal defined by the binary signals at the selected test points of the circuit under test.

* * * * *